(12) United States Patent
Jung et al.

(10) Patent No.: US 9,471,724 B2
(45) Date of Patent: Oct. 18, 2016

(54) APPARATUS AND METHOD FOR ESTIMATING RAILWAY VEHICLE MASSES

(71) Applicant: LSIS CO., LTD., Anyang-si, Gyeonggi-do (KR)

(72) Inventors: Jong Chul Jung, Seoul (KR); Yong Gee Cho, Seoul (KR)

(73) Assignee: LSIS CO., LTD., Anyang-si (KR)

( * ) Notice: Subject to any disclaimer, the term of this patent is extended or adjusted under 35 U.S.C. 154(b) by 876 days.

(21) Appl. No.: 13/794,040

(22) Filed: Mar. 11, 2013

(65) Prior Publication Data

US 2013/0238298 A1 Sep. 12, 2013

(30) Foreign Application Priority Data

Mar. 12, 2012 (KR) .................. 10-2012-0024978

(51) Int. Cl.
*G06F 17/50* (2006.01)
*G01G 19/08* (2006.01)
*G01G 19/04* (2006.01)

(52) U.S. Cl.
CPC ......... *G06F 17/5009* (2013.01); *G01G 19/045* (2013.01); *G01G 19/086* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,820,226 A * | 10/1998 | Hart | ...................... | B60T 13/665 303/20 |
| 5,828,979 A * | 10/1998 | Polivka | ............... | B61L 27/0016 246/167 R |
| 5,833,325 A * | 11/1998 | Hart | ...................... | B60T 8/1893 303/22.6 |
| 6,218,961 B1 * | 4/2001 | Gross | ........................ | B60T 7/22 246/122 R |
| 6,240,356 B1 | 5/2001 | Lapke | | |
| 2008/0128562 A1 * | 6/2008 | Kumar | .................... | B61C 17/12 246/186 |
| 2010/0174427 A1 * | 7/2010 | Sivasubramaniam | | B61L 15/0081 701/19 |
| 2011/0276309 A1 | 11/2011 | Yoon | | |
| 2013/0274966 A1 * | 10/2013 | Jung | ..................... | G01M 17/08 701/19 |

FOREIGN PATENT DOCUMENTS

CN 1415944 5/2003
CN 201583271 9/2010

OTHER PUBLICATIONS

The State Intellectual Property Office of the People's Republic of China Application Serial No. 201310078721.X, Office Action dated Sep. 3, 2014, 7 pages.

* cited by examiner

*Primary Examiner* — Thomas Tarcza
*Assistant Examiner* — Edward J Pipala
(74) *Attorney, Agent, or Firm* — Lee Hong Degerman Kang & Waimey; Jonathan Kang; Jeffrey Lotspeich

(57) ABSTRACT

Disclosed is an apparatus and method for estimating railway vehicle masses, the method comprising checking if a train has entered an initial acceleration section and a straight section, receiving a speed of the train, each acceleration of the plurality of railway vehicles and each traction of the plurality of railway vehicles, dynamically modeling the train, and estimating masses of the plurality of railway vehicles and rail gradient.

12 Claims, 3 Drawing Sheets

APPARATUS AND METHOD FOR ESTIMATING RAILWAY VEHICLE MASSES

CROSS REFERENCE TO RELATED APPLICATIONS

Pursuant to 35 U.S.C.§119 (a), this application claims the benefit of earlier filing dates and rights of priority to Korean Patent Application No. 10-2012-0024978, filed on Mar. 12, 2012, the contents of which are hereby incorporated by reference in their entirety.

BACKGROUND OF THE INVENTION

1. Field of the Invention

The present disclosure relates to an apparatus and method for estimating railway vehicle masses.

2. Description of Related Art

This section provides background information related to the present disclosure, which is not necessarily prior art.

In one of the prior art seeking a railway vehicle mass in a train system, a Korean Patent Laid-Open Publication 2011-0124054 proposes a load measuring system and method for a railway vehicle, in which an entire mass of a railway vehicle is calculated by detecting a current state of a rail based on rail gradient information of vehicle position, rail curve information of a current position of railway vehicle and weather information.

However, the conventional prior art relates to performance of a mass measurement to an entire rail. That is, an entire railway vehicle is considered a point mass to measure an entire mass of the railway vehicle.

Generally, a train is comprised of a plurality of railway vehicles each being connected, such that the number of passengers loaded in each railway vehicle is different, or mass of each railway vehicle is different according to cargo loaded on each railway vehicle. Furthermore, in a case a train is controlled to be applied with same acceleration/deceleration to each railway vehicle during brake or propulsion of the train, it is difficult to control the train using information on an entire mass of the railway vehicle alone.

Still furthermore, the abovementioned prior art is to calculate a load of an entire railway vehicle by receiving information from a database stored in response to a current position of a railway vehicle. That is, the abovementioned prior art suffers from problems in that, in order to calculate a mass of a train, data on speed, many database is required, as acceleration and current position of a railway vehicle are required, and information on gradient angle and curvature of a railway at a relevant position are also required.

The abovementioned prior art makes database of information on rail gradient by being associated with position information data. A position of a running railway vehicle is corrected when passing a balise, where an error may be generated on the position information due to calculation of position by receiving information of a tachometer before the railway vehicle passes the balise, to disadvantageously result in generation of an error on measurement of railway vehicle mass due to errors on rail gradient associated with position information and curvature information.

SUMMARY OF THE INVENTION

This section provides a general summary of the disclosure, and is not a comprehensive disclosure of its full scope or all of its features.

Exemplary aspects of the present disclosure are to substantially solve at least the above problems and/or disadvantages and to provide at least the advantages below.

The present disclosure is directed to provide an apparatus for estimating each individual railway vehicle mass in a train system connected to a plurality of railway vehicles, and a method thereof.

The present disclosure is also directed to provide an apparatus for estimating railway vehicle masses, configured to simultaneously estimate railway gradients by using information on speed and acceleration of railway vehicles obtainable from a current railway vehicle, and to thereby minimize errors of railway vehicle mass estimation without recourse to requirement of database on position information of the railway vehicle, and a method thereof.

Technical problems to be solved by the present disclosure are not restricted to the above-mentioned descriptions, and any other technical problems not mentioned so far will be clearly appreciated from the following description by skilled in the art.

In one general aspect of the present invention, there is provided an apparatus for estimating each railway vehicle mass and rail gradient of a plurality of railway vehicles in a train system including the plurality of railway vehicles, the apparatus comprising: a modeling unit configured to dynamically model a train; and an estimation unit configured to estimate masses of the plurality of railway vehicles and railway gradient using a dynamic modeling modeled by the modeling unit and by receiving a speed of the train, each acceleration of the plurality of railway vehicles and each traction of the plurality of railway vehicles.

In an exemplary embodiment of the present disclosure, the apparatus may further comprise storage configured to store masses of the plurality of railway vehicles and railway gradient.

In an exemplary embodiment of the present disclosure, the modeling unit may model in such a manner that a sum of multiplication of the masses of the plurality of railway vehicles by acceleration of each railway vehicle is a value in which traction of each railway vehicle is deducted by a gradient resistance of each railway vehicle, a running resistance of each railway vehicle and curving resistance of each railway vehicle.

In an exemplary embodiment of the present disclosure, the modeling unit may model the train in such a manner that the train runs on a straight section.

In an exemplary embodiment of the present disclosure, the modeling unit may model the train using friction factors and air resistance coefficient related to the running resistance as constants.

In an exemplary embodiment of the present disclosure, the modeling unit may model the train, considering that each railway vehicle has a same railway gradient.

In an exemplary embodiment of the present disclosure, the modeling unit may define the dynamic modeling in a regression form.

In an exemplary embodiment of the present disclosure, the estimation unit may estimate masses of the plurality of railway vehicles and the railway gradient from the regression form-defined model using a recursive least square.

In an exemplary embodiment of the present disclosure, the estimation unit may estimate a disturbance from the regression form-defined model, and may estimate the masses of plurality of railway vehicles and the railway gradient using the recursive least square that compensates the disturbance.

In another general aspect of the present disclosure, there is provided a method for estimating each railway vehicle mass and rail gradient of a plurality of railway vehicles in a train system including the plurality of railway vehicles, the method comprising: checking if a train has entered an initial acceleration section and a straight section; receiving a speed of the train, each acceleration of the plurality of railway vehicles and each traction of the plurality of railway vehicles; dynamically modeling the train; and estimating masses of the plurality of railway vehicles and rail gradient.

In an exemplary embodiment of the present disclosure, the method may further comprise storing the estimated masses of the plurality of railway vehicles and gradient.

In an exemplary embodiment of the present disclosure, the method may further comprise defining the dynamic modeling in a regression form.

In an exemplary embodiment of the present disclosure, the estimating step may include estimating the masses of plurality of railway vehicles and the railway gradient using the recursive least square from the regression form.

In an exemplary embodiment of the present disclosure, the estimating step may include a estimating disturbance from the regression form, and estimating the masses of plurality of railway vehicles and the railway gradient using the recursive least square that compensates the disturbance.

The present disclosure has an advantageous effect in that masses of each individual railway vehicle of a running train can be estimated without recourse to a physical sensor being attached for measuring the masses of the railway vehicles, and no database is required by estimating masses of each railway vehicle and railway gradient using information transmitted from speed and acceleration sensors and traction devices mounted on each railway vehicle.

The present disclosure has another advantageous effect in that errors can be reduced during estimation of railway vehicle masses due to no-use of database associated with position information, and the number of passengers on each railway vehicle can be estimated by estimating a mass of each railway vehicle in a train or a mass of passenger (railway vehicle mass—tare weight), whereby the number of passengers between stations can be estimated, and an effective train operation system can be set up in consideration of the estimated number of passengers between the stations.

BRIEF DESCRIPTION OF THE DRAWINGS

In the drawings, the width, length, thickness, etc. of components may be exaggerated or reduced for the sake of convenience and clarity. Furthermore, throughout the descriptions, the same reference numerals will be assigned to the same elements in the explanations of the figures, and explanations that duplicate one another will be omitted. Now, a voice coil motor according to the present disclosure will be described in detail with reference to the accompanying drawings.

The teachings of the present disclosure can be readily understood by considering the following detailed description in conjunction with the accompanying drawings, in which.

DETAILED DESCRIPTION OF THE INVENTION

Advantages and features of the present disclosure may be understood more readily by reference to the following detailed description of exemplary embodiments and the accompanying drawings. Detailed descriptions of well-known functions, configurations or constructions are omitted for brevity and clarity so as not to obscure the description of the present disclosure with unnecessary detail. Thus, the present disclosure is not limited to the exemplary embodiments which will be described below, but may be implemented in other forms. Accordingly, the described aspect is intended to embrace all such alterations, modifications, and variations that fall within the scope and novel idea of the present disclosure.

The meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

Now, exemplary embodiments of the present disclosure will be explained in detail together with the figures.

Figure 1:
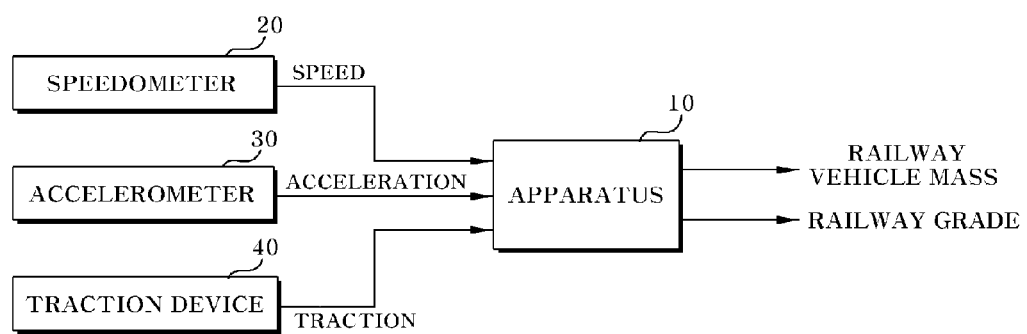
FIG. 1 is a schematic block diagram illustrating a train system according to an exemplary embodiment of the present disclosure.

FIG. 1 is a schematic block diagram illustrating a train system according to an exemplary embodiment of the present disclosure;

An apparatus (10) for estimating railway vehicle masses (hereinafter referred to as "apparatus") receives a speed, an acceleration and traction from a speedometer (20), an accelerometer (30) and a traction device (40), and uses the received speed, the acceleration and the traction for estimating the vehicle mass.

To be more specific, the speedometer (20) may be a speed sensor mounted at a front part of each railway vehicle, for example, and may measure a current speed of each railway vehicle and transmit the current speed to the apparatus (10). The accelerometer (30) may be an acceleration sensor mounted at each railway vehicle, for example, and may measure a current acceleration of each railway vehicle and transmit the current acceleration to the apparatus (10). Furthermore, the traction device (40) may measure traction applied to each railway vehicle and transmit the measured traction to the apparatus (10).

The apparatus (10) may use the inputted speed, acceleration and traction of each railway vehicle to estimate each railway mass and railway gradient during accelerated running of a train after leaving a station.

The present disclosure estimates each railway vehicle mass and railway gradient in a multi-railway vehicle train system where a plurality of railway vehicles is connected. When a train arrives at a station, passengers get on board the train and get off the train at a station, weight of each railway vehicle changes. That is, there is generated a change in mass of each railway vehicle between when a train pulls in a station and when a train leaves a station. Thus, the present disclosure can estimate each railway vehicle mass and railway gradient when a train leaves a station and initially accelerates.

Figure 2:
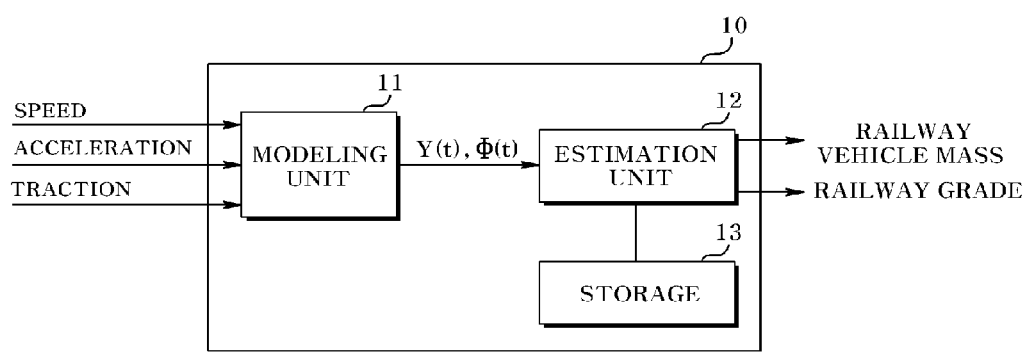
FIG. 2 is a schematic block diagram illustrating an apparatus for estimating railway vehicle masses according to an exemplary embodiment of the present disclosure.

FIG. 2 is a schematic block diagram illustrating an apparatus (10) for estimating railway vehicle masses according to an exemplary embodiment of the present disclosure.

Referring to FIG. 2, the apparatus (10) comprises a modeling unit (11), an estimation unit (12) and storage (13).

Figure 3:
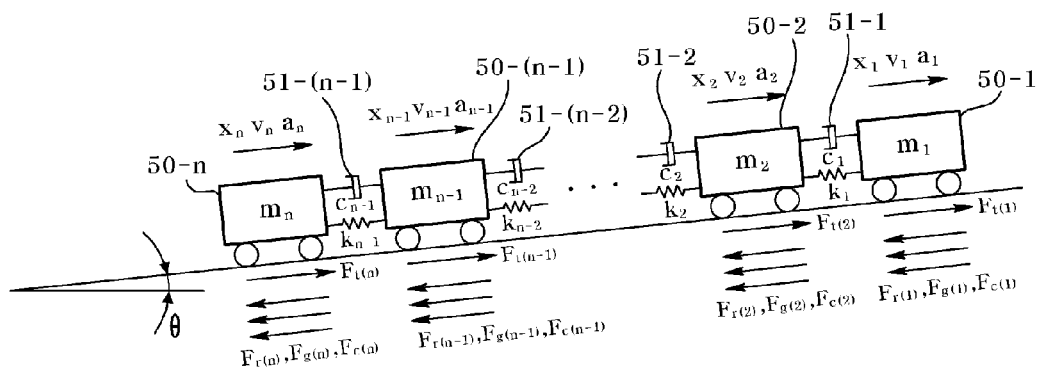
FIG. 3 is an exemplary view illustrating a train consisted of a plurality of railway vehicles modeled by a modeling unit of FIG. 2.

The modeling unit (11) models a multi-railway vehicle train. FIG. 3 is an exemplary view illustrating a train consisted of a plurality of railway vehicles modeled by a modeling unit (11) of FIG. 2, where $m_n$ is a mass of $n^{th}$ railway vehicle (50-$n$), $a_n$ is an acceleration of $n^{th}$ railway vehicle (50-$n$), $v_n$ is a speed of $n^{th}$ railway vehicle (50-$n$), $F_{g(n)}$ is a traction of $n^{th}$ railway vehicle (50-$n$), $F_{r(n)}$ is a running resistance of $n^{th}$ railway vehicle, $F_{g(n)}$ is a gradient resistance of $n^{th}$ railway vehicle (50-$n$) and $F_{c(n)}$ is a curving resistance of $n^{th}$ railway vehicle.

Furthermore, $k_{n-1}$ is a spring coefficient of a coupler (51-(n-1)) between $n^{th}$ railway vehicle (50-$n$) and n-$1^{th}$ railway vehicle (50-(n-1)), $c_{n-1}$ is a damping coefficient of a coupler (51-(n-1)) between $n^{th}$ railway vehicle (50-$n$) and n-$1^{th}$ railway vehicle (50-(n-1)).

A dynamic model Equation of a multi-railway vehicle train is such that a first railway vehicle (50-1) may be modeled by the following Equation 1, an $i^{th}$ railway vehicle (50-1) may be modeled by the following Equation 2, and an $n^{th}$ (last) railway vehicle (50-$n$) may be modeled by the following Equation 3.

$$m_1 a_1 + c_1(v_1 - v_2) + k_1(x_1 - x_2) = F_{t(1)} - F_{r(1)} - F_{g(1)} - F_{c(1)} \quad \text{[Equation 1]}$$

$$m_i a_i + c_{i-1}(v_i - v_{i-1}) + c_i(v_i - v_{i-1}) + k_{i-1}(x_i - x_{i-1}) + k_i(x_i - x_{i-1}) = F_{t(i)} - F_{r(i)} - F_{g(i)} - F_{c(i)} \quad \text{[Equation 2]}$$

$$m_n a_n + c_{n-1}(v_n - v_{n-1}) + k_{-n}(x_n - x_{n-1}) = F_{t(n)} - F_{r(n)} - F_{g(n)} - F_{c(n)} \quad \text{[Equation 3]}$$

Referring to FIG. 3, each railway vehicle (50) is connected by a coupler (51), and each coupler (51-1~51-(n-1)) may be modeled by mass-less spring damper system. Furthermore, a running resistance and a gradient resistance of the modeling unit (11) may be modeled by the following Equations 4 and 5.

$$F_{r(i)} = r_0^i + r_1^i v_i + r_2^i v_i^2 \quad \text{[Equation 4]}$$

$$F_{g(i)} = m_i g \sin \theta_i, \quad \text{[Equation 5]}$$

where, $r_0^i$ and $r_1^i$ are constants related to friction factors at the $i^{th}$ railway vehicle, $r_2^i$ is a constant related to air resistance at the $i^{th}$ railway vehicle, which may be obtained by experiments. $\theta_i$ is a railway gradient at each position of the $i^{th}$ railway vehicle. The following Equation may be induced by removing all terms related to spring coefficient ($k_i$) and damping coefficient ($c_i$), if the Equation 1, Equation 2 and Equation 3 are added.

$$m_1 a_1 + m_2 a_2 + \Lambda + m_{n-1} a_{n-1} + m_n a_n = \quad \text{[Equation 6]}$$
$$F_{t(1)} + F_{t(2)} + \Lambda + F_{t(n-1)} + F_{t(n)} - F_{g(1)} -$$
$$F_{g(2)} - \Lambda - F_{g(n-1)} - F_{g(n)} - F_{r(1)} - F_{r(2)} - \Lambda -$$
$$F_{r(n-1)} - F_{r(n)} - F_{c(1)} - F_{c(2)} - \Lambda - F_{c(n-1)} - F_{c(n)}$$

In order to estimate mass and railway gradient of each railway vehicle, the apparatus (10) according to the present disclosure assumes the following several conditions.

First, the estimation by the estimation unit (12) is performed at an initial acceleration section after the train leaves a station. Generally, a change in mass of the train is generated only before arrival of a station and after start from a station, such that it is reasonable to estimate a railway vehicle mass at the initial acceleration section after start from the station.

Second, mass and railway gradient are estimated when a train runs at a straight section. That is, the estimation is performed only at a section where a lateral acceleration of a train is very small. A curving resistance of a train may be negligible at the straight section to make a dynamic model of the train simpler, whereby there is an advantage of dispensing with storage of database on curvature of a railway.

Third, the friction factors ($r_0^i$ and $r_1^i$) and air resistance coefficient ($r_2^i$) related to running resistance of a train are determined by experiments, being not changeable to a great degree, and are therefore assumed as constants.

Fourth, it is assumed that each railway vehicles are running on a railway having a same railway gradient. That is, it is assumed that each railway is running on a railway having the same gradient. The railway gradient is not greatly changed at a predetermined section, such that this assumption is reasonable.

Fifth, a speed of each railway vehicle is assumed to be substantially same. That is, a value measured by the speedometer (20) installed at a front part of a train is assumed as the speed of each railway vehicle. Each railway vehicle (50) is connected by the coupler (51), such that each speed of railway vehicles may be assumed as being same.

Based on the above assumption, if the Equation 6 is simplified and Equations 4 and 5 are combined, we can derive the following Equation 7.

$$m_1 a_1 + m_2 a_2 + \Lambda + m_{n-1} a_{n-1} + m_n a_n = F_{t(1)} + F_{t(2)} + \Lambda + \quad \text{[Equation 7]}$$
$$F_{t(n-1)} + F_{t(n)} - (m_1 + m_2 + \Lambda + m_{n-1} + m_n) g \sin \theta -$$
$$(r_0^1 + r_0^2 + \Lambda + r_0^{n-1} + r_0^n) -$$
$$(r_1^1 v_1 + r_1^2 v_2 + \Lambda + r_1^{n-1} v_{n-1} + r_1^n v_n) -$$
$$(r_2^1 v_1^2 + r_1^2 v_2^2 + \Lambda + r_1^{n-1} v_{n-1}^2 + r_1^n v_n^2)$$

Furthermore, in consideration of the fifth assumption in the above assumption of modeling unit (11), speed of each railway vehicle is almost same, such that the Equation 7 may be simplified as being expressed by the following Equation 8.

$$m_1 a_1 + m_2 a_2 + \Lambda + m_{n-1} a_{n-1} + m_n a_n = F_{t(1)} + F_{t(2)} + \Lambda + \quad \text{[Equation 8]}$$
$$F_{t(n-1)} + F_{t(n)} - (m_1 + m_2 + \Lambda + m_{n-1} + m_n) g \sin \theta -$$
$$(r_0^1 + r_0^2 + \Lambda + r_0^{n-1} + r_0^n) - (r_1^1 + r_1^2 + \Lambda + r_1^{n-1} + r_1^n) v -$$
$$(r_2^1 + r_1^2 + \Lambda + r_1^{n-1} + r_1^n) v^2$$

where, v is a speed of an entire train received from the speedometer (20) installed at the front part of the train, and θ is a railway gradient of a position on which the train is positioned.

The modeling unit (11) defines the Equation 8 as the following Equation 9 in a regression form in order to estimate the railway vehicle mass and railway gradient of each railway vehicle.

$$Y = \Phi^T \Theta \quad \text{[Equation 9]}$$

where, Y, $\Phi$ and $\Theta$ are may be defined by the following Equations 10, 11 and 12.

$$Y := F_{t(1)} + F_{t(2)} + \Lambda + F_{t(n-1)} + \quad \text{[Equation 10]}$$
$$F_{t(n)} - (r_0^1 + r_0^2 + \Lambda + r_0^{n-1} + r_0^n) -$$
$$(r_1^1 + r_1^2 + \Lambda + r_1^{n-1} + r_1^n)v - (r_2^1 + r_1^2 + \Lambda + r_1^{n-1} + r_1^n)v^2$$

$$\Phi^T := [a_1 a_2 \Lambda\, a_{n-1} a_n g] \quad \text{[Equation 11]}$$

$$\Theta = \begin{bmatrix} m_1 \\ m_2 \\ M \\ m_{n-1} \\ m_n \\ (m_1 + m_2 + \Lambda + m_{n-1} + m_n)\sin\theta \end{bmatrix} \quad \text{[Equation 12]}$$

The traction is received from a traction device (40), acceleration of each railway vehicle is received from the accelerometer (30) provided to each railway vehicle, and a speed of a railway vehicle is received from the speedometer (20) provided to the front part of the train, whereby only the information railway vehicle mass and railway gradient of each railway vehicle remain unknown in Equation 9.

The estimation unit (12) in the apparatus (10) according to the present disclosure uses the models modeled by the modeling unit (11) to estimate the railway vehicle masses of each railway vehicle and railway gradient, which may be illustrated with reference to the following drawing.

Figure 4:
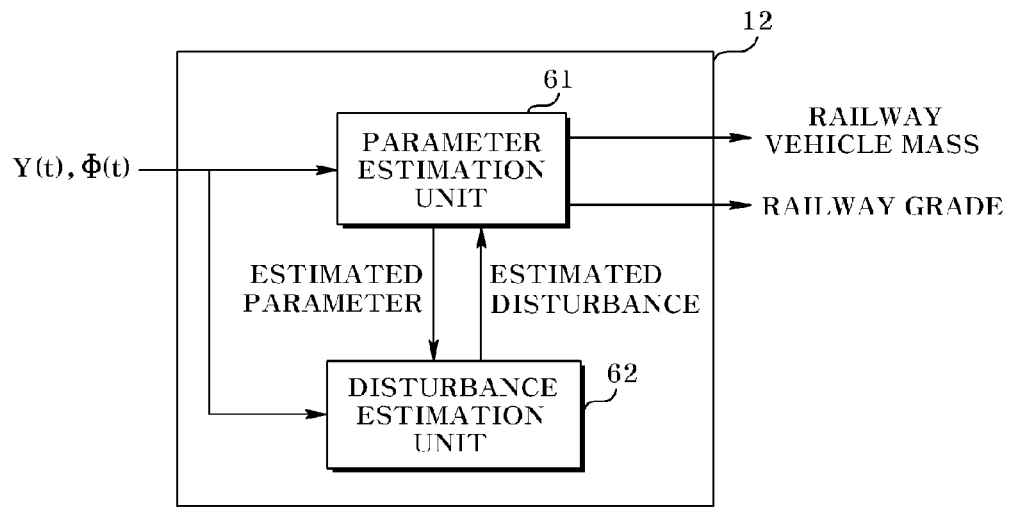
FIG. 4 is a detailed block diagram illustrating an estimation unit of FIG. 2.

FIG. 4 is a detailed block diagram illustrating an estimation unit of FIG. 2.

Referring to FIG. 4, an estimation unit (12) includes a parameter estimation unit (61) and a disturbance estimation unit (62).

The estimation unit (12) according to the present disclosure may add a disturbance to a railway vehicle model of Equation 9 to derive the following Equation 13, which is to enhance robustness of estimation.

$$Y = \Phi^T \Theta + \eta \quad \text{[Equation 13]}$$

The disturbance term ($\eta$) in the Equation 13 may be defined by a disturbance existing on the system, and may include a modeling error or a sensor noise. In order to prevent the estimation performance from being degraded in the present disclosure, the disturbance estimation unit (62) for compensation of possible degradation of estimation performance is introduced. Furthermore, the parameter estimation unit (61) estimates parameters using the Recursive Least Square, for example.

The disturbance estimation unit (62) includes a disturbance observer that estimates a disturbance, based on the dynamic models of the system and the measurement value of the system, and compensates the disturbance using an estimation value therefrom, in a case the disturbance exists in the system, and serves to enhance robustness in parameter estimation by minimizing an influence of the disturbance by the Recursive Least Square performed by the parameter estimation unit (61), in a case a modeling error or a disturbance exists in the system.

In a case the disturbance is estimated by the disturbance estimation unit (62), the parameter estimation by the Recursive Least Square of the parameter estimation unit (61) includes a Q-filter and may be defined as below:

$$\hat{\Theta}(t) = \hat{\Theta}(t-1) + P(t)\Phi^T(t)(Y(t) - \Phi^T(t)\hat{\Theta}(t-1) - \hat{\eta}(t)) \quad \text{[Equation 14]}$$

$$P(t) = P(t-1) - P(t-1)\Phi^T(t)P(t-1)\Phi(t))^{-1}\Phi^T(t)P(t-1) \quad \text{[Equation 15]}$$

$$\hat{\eta}(t) = Q(z)(Y(t) - \Phi^T(t)\hat{\Theta}(t-1)), \quad \text{[Equation 16]}$$

where, $\hat{\Theta}(t)$ and $\hat{\eta}(t)$ are a vector-type parameter estimated by the parameter estimation unit (61) and a disturbance estimated by the disturbance estimation unit (62). Furthermore, $P(t)^{-1} = \Phi^T(t)\Phi(t)$. Still furthermore, $Q(z)$ is a Q-filter having a low pass filter characteristic, and may be designed in consideration of characteristic of disturbance, a sampling time and the like.

That is, the vector-type parameter estimated by the parameter estimation unit (61) may be expressed by the following Equation 17.

$$\hat{\Theta} = \begin{bmatrix} \hat{m}_1 \\ \hat{m}_2 \\ M \\ \hat{m}_{n-1} \\ \hat{m}_n \\ (\hat{m}_1 + \hat{m}_2 + \Lambda + \hat{m}_{n-1} + \hat{m}_n)\sin\hat{\theta} \end{bmatrix} \quad \text{[Equation 17]}$$

where, $\hat{m}_1$, $\hat{m}_2$, $\Lambda$, $\hat{m}_{n-1}$, $\hat{m}_n$ are an estimated mass of each railway vehicle, and $\hat{\theta}$ is an estimated railway gradient. Thus, the estimated mass of each railway vehicle and the estimated railway gradient may be calculated by the following Equations 18 and 19.

$$\hat{m}_i = \hat{\Theta}(i) \quad (i = 1, \Lambda, n) \quad \text{[Equation 18]}$$

$$\hat{\theta} = \sin^{-1}\left(\frac{\hat{\Theta}(n+1)}{\sum_{i=1}^{n} \hat{\Theta}(i)}\right) \quad \text{[Equation 19]}$$

The storage (13) in FIG. 2 stores the estimated mass of each railway vehicle and the estimated railway gradient estimated by the estimation unit (12). The storage (13) may store an estimated mass of each railway vehicle and an estimated railway gradient estimated when a train leaves each station by making a database thereof, and by way of non-limiting example, may divide and store the estimated mass of each railway vehicle and the estimated railway gradient separately.

In the present disclosure, a dynamic model of longitudinal-direction speed of a train was estimated by using measurement values of a train including a longitudinal-direction speed of a train measured by the speedometer (20) installed at the front part of the train, acceleration of each railway vehicle measured by the accelerometer (30) mounted at each railway vehicle and traction measured by each traction device (40), and each railway vehicle mass of individual railway vehicle and railway gradient were estimated by using the Recursive Least Square of the disturbance estimation unit.

Although the Recursive Least Square has been utilized for estimation of disturbance and compensation thereof as an estimation method of parameters in the present disclosure, the present disclosure is not limited thereto, and it should be apparent to the skilled in the art that parameters may be estimated by the Recursive Least Square without estimation of disturbance. Furthermore, it should be also apparent to the skilled in the art that other parameter estimation methods may be used instead of being limited to the Recursive Least Square.

Figure 5:
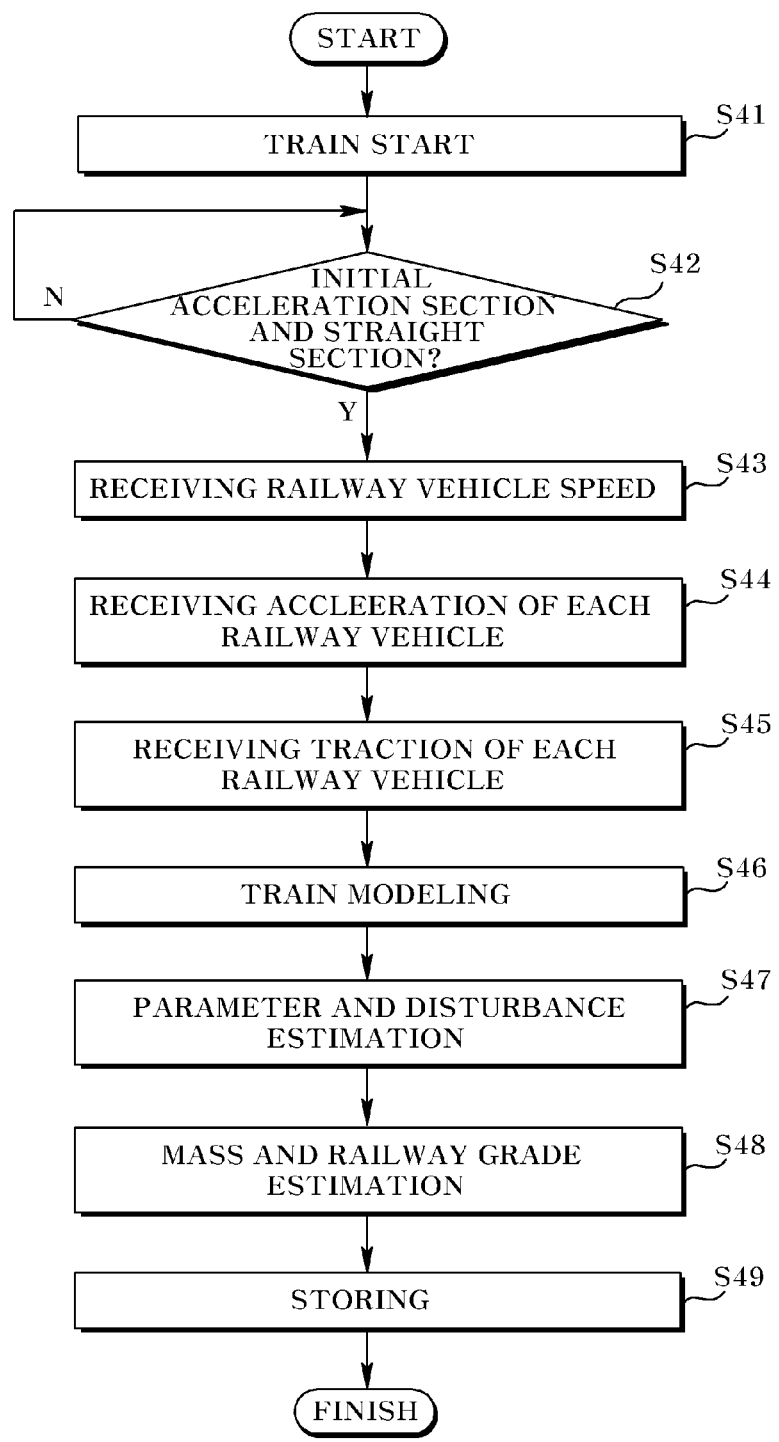
FIG. 5 is a flowchart illustrating a method for estimating railway vehicle masses according to the present disclosure.

FIG. 5 is a flowchart illustrating a method for estimating railway vehicle masses according to the present disclosure.

Referring to FIG. 5, as a train leaves a station (S41), the railway vehicles are propelled to increase an amount of longitudinal acceleration to a straight direction. Then, a lateral acceleration of the railway vehicles becomes almost zero, in a case the train runs on a straight section, at which time the estimation of railway vehicle mass according to the present disclosure is performed, in a case the train runs under this condition.

That is, in a case the train is at an initial acceleration section and the straight section (S42), a speed of the train, an acceleration of each railway vehicle and a traction of each railway vehicle are received from the speedometer (20), the accelerometer (30) and the traction device (40) (S43, S44, S45). The time sequence of S43 to S45 is not limited thereto, and reception of the information thereof may be simultaneously received.

Thereafter, the modeling unit (11) dynamically models the train using the Equation 8, and defines in the regression form as in Equation 9 (S46). The parameters and disturbance are respectively estimated by the parameter estimation unit (61) and the disturbance estimation unit (62) (S47) to estimate each railway vehicle mass and railway gradient (S48).

The storage (13) stores and makes a database of the railway vehicle masses and railway gradient estimated by the estimation unit (12) (S49).

The present disclosure has proposed an estimation method using dynamic modeling and estimation methods of each railway vehicle mass and railway gradient in a train system connected by a plurality of railway vehicles, and effects thereof are as below:

First, a physical sensor for measuring railway vehicle masses can be dispensed with to estimate each railway vehicle mass and railway gradient while a train is running. Second, information transmitted from a speedometer, an accelerometer and a traction device mounted on each railway vehicle is utilized to estimate each railway vehicle mass and railway gradient.

Third, a mass of each railway vehicle in a train or a mass of passengers can be estimated (railway vehicle mass-tare weight) to estimate the number of passengers on each railway vehicle.

Fourth, the estimated railway vehicle mass can be utilized for a train control system for distribution of traction and braking force.

Fifth, position information or railway information is not required for estimation of each railway vehicle including the number of passengers, whereby no excessive database is required.

Sixth, the number of passengers at each station can be estimated through estimation of each railway vehicle mass, and an effective train operation system can be constructed in consideration thereof.

The above-mentioned meter capable of having communication security and a data transmitting/receiving system using the same according to the present disclosure may, however, be embodied in many different forms and should not be construed as limited to the embodiment set forth herein. Thus, it is intended that embodiment of the present disclosure may cover the modifications and variations of this disclosure provided they come within the scope of the appended claims and their equivalents. While particular features or aspects may have been disclosed with respect to several embodiments, such features or aspects may be selectively combined with one or more other features and/or aspects of other embodiments as may be desired.

What is claimed is:

1. An apparatus for estimating each railway vehicle mass and rail gradient of a plurality of railway vehicles in a train including the plurality of railway vehicles, the apparatus comprising:
    a modeling unit configured to dynamically model the train by:
        receiving, via a speed sensor, a speed of the train;
        receiving, via acceleration sensors, an acceleration of each of the plurality of railway vehicles;
        receiving, via a traction device, a traction of the plurality of railway vehicles, wherein the speed, the acceleration, and the traction are received when the train is at an initial acceleration section of a railway and when the train is at a straight section of the railway; and
    an estimation unit configured to estimate masses of the plurality of railway vehicles and railway gradient using a dynamic modeling modeled by the modeling unit; and
    wherein the modeling unit models in such a manner that a sum of multiplication of the masses of the plurality of railway vehicles by acceleration of each railway vehicle is a value in which traction of each railway vehicle is deducted by a gradient resistance of each railway vehicle, a running resistance of each railway vehicle, and curving resistance of each railway vehicle.

2. The apparatus of claim 1, further comprising:
    storage configured to store masses of the plurality of railway vehicles and railway gradient.

3. The apparatus of claim 1, wherein the modeling unit models the train using friction factors and air resistance coefficient related to the running resistance as constants.

4. The apparatus of claim 1, wherein the modeling unit models the train, considering that each railway vehicle has a same railway gradient.

5. The apparatus of claim 1, wherein the modeling unit defines the dynamic modeling in a regression form.

6. The apparatus of claim 5, wherein the estimation unit estimates masses of the plurality of railway vehicles and the railway gradient from the regression form-defined model using a recursive least square.

7. The apparatus of claim 1, wherein the estimation unit estimates a disturbance from the regression form-defined model, and estimates the masses of plurality of railway vehicles and the railway gradient using the recursive least square that compensates the disturbance.

8. A method for estimating each railway vehicle mass and rail gradient of a plurality of railway vehicles in a train system including the plurality of railway vehicles, the method comprising:
    checking if a train has entered an initial acceleration section or a straight section;
    receiving, via a speed sensor, a speed of the train;
    receiving, via acceleration sensors, an acceleration of each of the plurality of railway vehicles;
    receiving, via a traction device, a traction of the plurality of railway vehicles, wherein the speed, the acceleration, and the traction are received when the train is at an initial acceleration section of a railway and when the train is at a straight section of the railway
    dynamically modeling the train based on the speed of the train, each acceleration of the plurality of railway vehicles and each traction of the plurality of railway vehicles in such a manner that a sum of multiplication of the masses of the plurality of railway vehicles by acceleration of each railway vehicle is a value in which traction of each railway vehicle is deducted by a gradient resistance of each railway vehicle, a running resistance of each railway vehicle, and curving resistance of each railway vehicle; and estimating masses of the plurality of railway vehicles and rail gradient.

9. The method of claim 8, further comprising:

storing the estimated masses of the plurality of railway vehicles and gradient.

10. The method of claim 8, further comprising:

defining the dynamic modeling in a regression form.

11. The method of claim 10, wherein the estimating includes estimating the masses of plurality of railway vehicles and the railway gradient using the recursive least square from the regression form.

12. The method of claim 10, wherein the estimating includes estimating a disturbance from the regression form, and estimating the masses of plurality of railway vehicles and the railway gradient using the recursive least square that compensates the disturbance.

\* \* \* \* \*